(12) United States Patent
Pan et al.

(10) Patent No.: US 10,425,064 B2
(45) Date of Patent: Sep. 24, 2019

(54) APPARATUS AND METHOD FOR A PVT INDEPENDENT RC DELAY

(71) Applicant: Micron Technology, Inc., Boise, ID (US)

(72) Inventors: Dong Pan, Boise, ID (US); Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/373,158

(22) Filed: Dec. 8, 2016

(65) Prior Publication Data

US 2018/0167057 A1  Jun. 14, 2018

(51) Int. Cl.
 *H03K 3/011* (2006.01)
 *H03K 5/14* (2014.01)
 *H03K 5/00* (2006.01)

(52) U.S. Cl.
 CPC ............... *H03K 3/011* (2013.01); *H03K 5/14* (2013.01); *H03K 2005/00019* (2013.01)

(58) Field of Classification Search
 CPC ...................................................... H03K 3/011
 See application file for complete search history.

(56) References Cited

U.S. PATENT DOCUMENTS

| | | | | |
|---|---|---|---|---|
| 4,983,929 A | * | 1/1991 | Real .......................... | G05F 3/262 330/277 |
| 5,061,907 A | * | 10/1991 | Rasmussen ............. | G05F 3/247 331/108 B |
| 5,081,380 A | * | 1/1992 | Chen ....................... | H03K 5/133 323/312 |
| 5,250,914 A | * | 10/1993 | Kondo .................... | H03K 3/011 331/111 |
| 5,311,115 A | * | 5/1994 | Archer ................. | H01L 27/0883 257/E27.061 |
| 5,359,296 A | * | 10/1994 | Brooks ...................... | G05F 3/26 330/288 |
| 5,545,972 A | * | 8/1996 | Kiehl ......................... | G05F 3/26 323/315 |
| 5,638,028 A | * | 6/1997 | Voth ....................... | H03L 7/0802 327/105 |
| 5,689,516 A | * | 11/1997 | Mack ............. | G01R 31/318516 714/725 |
| 5,835,994 A | * | 11/1998 | Adams .................... | G05F 3/262 323/315 |

(Continued)

*Primary Examiner* — Thomas J. Hiltunen
(74) *Attorney, Agent, or Firm* — Schwegman Lundberg & Woessner, P.A.

(57) ABSTRACT

Apparatus and methods for a delay circuit are provided. In an example, a delay circuit can include a resistor configured to receive a compensation current, a capacitor configured to receive a charge current based on the compensation current, a first compensation circuit configured to provide a control signal, and a charge-current coupling circuit. The first compensation circuit can include an inverter circuit configured to track an inverter threshold voltage across process, voltage and temperature variations, wherein an output of the inverter circuit is directly coupled to an input of the inverter circuit, and an amplifier configured to receive the output of the inverter circuit an provide the control signal. The charge-current coupling circuit can be configured to receive the control signal and to provide the compensation current and the charge current.

16 Claims, 3 Drawing Sheets

(56) References Cited

U.S. PATENT DOCUMENTS

| | | | | |
|---|---|---|---|---|
| 6,803,803 B1* | 10/2004 | Starr | H03K 19/00384 |
| | | | 327/378 |
| 7,019,576 B1* | 3/2006 | Sancheti | H03H 11/265 |
| | | | 327/261 |
| 7,378,876 B2* | 5/2008 | Vu | H03K 5/1515 |
| | | | 326/119 |
| 8,004,337 B2* | 8/2011 | Brannen | H03K 5/133 |
| | | | 327/264 |
| 8,742,815 B2* | 6/2014 | Wadhwa | H03K 3/356104 |
| | | | 327/262 |
| 8,803,550 B2* | 8/2014 | Bhuiyan | H03K 19/017509 |
| | | | 326/22 |
| 8,988,959 B2* | 3/2015 | Roy | G11C 7/067 |
| | | | 327/51 |
| 8,994,433 B2* | 3/2015 | Lin | H03K 3/011 |
| | | | 327/291 |
| 9,147,443 B2* | 9/2015 | Hanson | G11C 5/147 |
| 9,287,823 B1* | 3/2016 | Holzmann | H01L 29/772 |
| 2006/0226893 A1* | 10/2006 | Abel | G05F 3/262 |
| | | | 327/543 |
| 2007/0279141 A1* | 12/2007 | Chui | H03K 4/502 |
| | | | 331/158 |
| 2008/0061825 A1* | 3/2008 | Hsu | H03K 19/018528 |
| | | | 326/68 |
| 2009/0045853 A1* | 2/2009 | Lee | G09G 5/008 |
| | | | 327/144 |
| 2009/0302954 A1* | 12/2009 | Chen | H03K 3/011 |
| | | | 331/66 |
| 2011/0298556 A1* | 12/2011 | Lin | H03L 1/022 |
| | | | 331/186 |
| 2012/0126616 A1* | 5/2012 | Hu | G05F 1/561 |
| | | | 307/31 |
| 2012/0212265 A1* | 8/2012 | Quan | H03K 5/133 |
| | | | 327/155 |
| 2014/0152348 A1* | 6/2014 | Hu | H03K 3/01 |
| | | | 327/108 |
| 2017/0288651 A1* | 10/2017 | Khare | H03K 3/0322 |

* cited by examiner

US 10,425,064 B2

APPARATUS AND METHOD FOR A PVT INDEPENDENT RC DELAY

BACKGROUND

Memory devices such as dynamic random access memory (DRAM) devices can include delay elements to assist with regulating timing of certain signals and functions. Present techniques for implementing delay elements can include a resistor-capacitor (RC) network disposed between two inverters. Such networks are easy to implement and can be efficient with respect to chip space compared to alternative implementations. However, the actual delay of such delay elements can vary significantly, such as about 30%-35% with respect to process, voltage and temperature variations (PVT).

OVERVIEW

Apparatus and methods for a delay circuit are provided. In an example, a delay circuit can include a resistor configured to receive a compensation current, a capacitor configured to receive a charge current based on the compensation current, a first compensation circuit configured to provide a control signal, and a charge-current coupling circuit. The first compensation circuit can include an inverter circuit configured to track an inverter threshold voltage across process, voltage and temperature variations, wherein an output of the inverter circuit is directly coupled to an input of the inverter circuit, and an amplifier is configured to receive the output of the inverter circuit and provide the control signal. The charge-current coupling circuit can be configured to receive the control signal and to provide the compensation current and the charge current.

This overview is intended to provide an overview of subject matter of the present patent application. It is not intended to provide an exclusive or exhaustive explanation of the subject matter. The detailed description is included to provide further information about the subject matter of the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized apparatus and methods that can reduce PVT delay variation of a RC-based delay element significantly from present RC-based devices. In some examples, an apparatus can include a first circuit for compensating for process and voltage variation of trip points or threshold voltage variations of inverters used in the RC-based devices and a second circuit for compensating temperature variation of the resistor portion of the delay element. In certain examples, the first and second circuit can be implemented with a resistance in a base circuit of an integrated circuit. The base circuit can provide a global compensation signal for the integrated circuit. One or more additional circuits can receive the global compensation signal and can include a capacitance and one or more inverters. The one or more additional circuits can each receive an input signal and provide a delayed representation of the input signal at an output. Thus, an integrated circuit, such as for a DRAM memory system can include multiple delay elements that use the single base circuit and multiple additional circuits to provide delay intervals that may vary less than 10% across PVT. In certain examples where power to the delay elements is regulated, delay interval variation across PT can be less than 4%.

Figure 1:
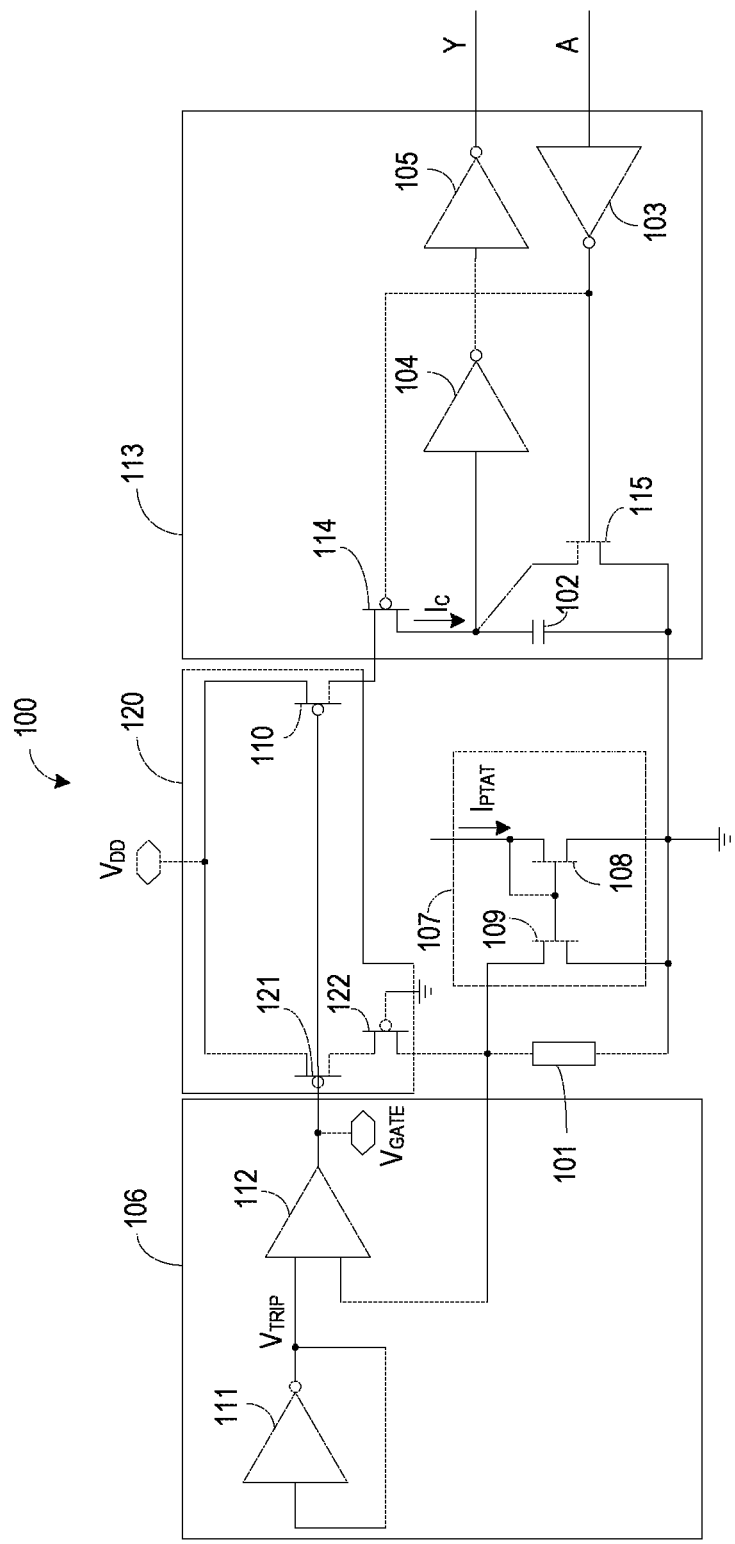
FIG. 1 illustrates generally an RC-based delay element 100 according to an example of the present subject matter.

FIG. 1 illustrates generally an RC-based delay element 100 according to an example of the present subject matter. The delay element 100 can include a resistor (R) 101 or a resistive element, a capacitor 102, or a capacitive element, one or more inverters 103, 104, 105, a first compensation circuit 106, a charge-current coupling circuit 120, and an optional second compensation circuit 107 that, in certain examples, may form part of the first compensation circuit 106. In certain examples, the resistor 101 is not as directly connected with the capacitor 102. For example, the resistor 101 can be part of the first compensation circuit 106, and the capacitor 102 can be part of an interface circuit 113. The decoupled nature of the delay element 100 allows charge current ($I_C$) of the capacitor 102 to be manipulated such that PVT variations can be compensated by a control signal ($V_{gate}$).

In operation, an input signal (A) at a low logic level, can become a high logic level at an output of an input inverter 103. The high logic level of the output of the input inverter 103 can place a first interface control transistor 114 in a high impedance state that isolates the capacitor 102 from receiving charge current via a second control transistor 110 of the charge-current coupling circuit 120. Simultaneously, the input signal (A) at the low logic level can place a second interface control transistor 115 in a low impedance state that can discharge the capacitor 102 and bring the input of a first output inverter 104 to a low logic level. In turn, the output of the first output inverter 104 and the input of the second output inverter 105 can be in a high logic state. Consequently, the output of the second output inverter 105, the output (Y) of the delay element, can be at a low logic state.

When the input (A) of the delay element transitions from the low logic state to a high logic state, the second interface transistor 115 can receive a control signal in a low logic state via the input inverter 103. The low logic state of the control signal of the second interface transistor 115 can place the second interface control transistor 115 in a high impedance mode such that the capacitor 102 can charge. The low logic signal received at the first interface control transistor 114 from the input inverter 103, can place the first interface control transistor 114 in a low impedance mode allowing charge current ($I_C$) to pass the capacitor 102 via the second control transistor 110 of the charge-current coupling circuit 120. As the capacitor charges, the voltage at the input of the first output inverter 104 can begin to rise from a low logic state. As the voltage at the input of the first output inverter 104 passes the trigger threshold voltage, the output of the first output inverter 104 can transition from a high logic level to a low logic level and the output of the second output inverter 105, and the output (Y) of the delay element 100, can transition from a low logic level to a high logic level. Thus, the output (Y) of the delay element 100 can provide a delayed representation of a rising transition of the input (A). The delay interval can be determined by the value of the resistor 101 and the capacitor 102.

In certain examples, the first compensation circuit 106 coupled to the resistor 101 can be configured to track PVT changes associated with the one or more inverters 103, 104, 105 coupled to the capacitor 102 and to provide an output that can adjust operation of the RC network such that variation of the delay interval due to PVT of one or more of the output inverters 104, 105 is reduced. In certain examples, a compensation current, passed by the resistor 101 via a first control transistor 121 of the charge-current coupling circuit 120 can be duplicated via the second control transistor 110 of the charge-current coupling circuit 120 to provide the charging current ($I_C$) of the capacitor 102. In certain examples, the charge-current coupling circuit 120 can include a matching transistor 122 such current delivered to the resistor 101 and the capacitor 102 are matched. In certain examples, the matching transistor 122 can be maintained in a low impedance state during operation. An output signal ($V_{gate}$) of the first compensation circuit 106 can be used to trim the charge current so as to cancel effects of PVT associated with the output inverters 104, 105.

In certain examples, an optional second compensation circuit 107 can be configured to compensate for temperature effects that can vary the effective resistance of the resistor 101 or resistor element. In some examples, the optional second compensation circuit 107 can be configured to compensate for temperature effects that can vary the effective capacitance of the capacitor 102 or capacitive element. In certain examples, the optional second compensation circuit 107 can be configured to compensate for temperature effects that can vary the effective resistance of the resistor 101 or resistor element and the effective capacitance of the capacitor 102 or capacitive element.

In general, resistance of a resistor is known to vary in a manner that is generally proportional to temperature, such that as temperature rises, resistance of a resistor can also rise. Similarly, capacitance of a capacitor is known to vary in a manner that is generally proportional to temperature, such that as temperature rises, capacitance of a capacitor can also rise. In certain examples, the second compensation circuit 107 can include a current mirror that receives sense current ($I_{PTAT}$) that is proportional to absolute temperature (PTAT) at a sense transistor 108 of the current mirror. The mirror transistor 109 of the current mirror can be configured to change the compensation current, which is flowing via the first control transistor 121, based on the sense current ($I_{PTAT}$). In examples where the capacitor 102 or capacitive element is a MOS capacitor, a rising temperature can lower the MOS capacitor threshold voltage such that the capacitance appears to increase. Thus, without compensation, the resistance and capacitance can effectively rise with temperature and in turn provide longer RC delays. The second compensation circuit 107 can increase the compensation current in a manner proportional to temperature. The current provided to the resistor 101 summed with the current of the second compensation circuit 107 can be scaled and mirrored to the capacitor 102 via a second mirror transistor 110. The summed and scaled current, the charge current ($I_C$), can be manipulated via the control signal (Vgate) of the second mirror transistor 110 and can alleviate temperature effects of the resistor 101 and capacitor 102 that contribute to delay interval variations across temperature. As such, at least a portion of the control signal (Vgate) can be indicative of PVT variations associated with the output inverters 104, 105 as well as temperature variations of the delay circuit 100.

Referring back to the first compensation circuit 106, in certain examples, the first compensation circuit 106 can include a comp inverter 111 having an output coupled to an input. The output can also be coupled to an amplifier 112 loosely arranged as a voltage follower. The comp inverter 111 can provide the trip voltage ($V_{TRIP}$) of the comp inverter 111 at the output. As such, the trip voltage provided by the comp inverter 111 will track PVT variations of the other inverters 103, 104, 105 of the delay element 100. Using the output of the voltage follower amplifier 112 to control the charge current ($I_C$) of the capacitor 102 can allow PVT variations of the one or more output inverters 104, 105 to be substantially negated.

In certain examples, an integrated circuit such as a memory circuit or a memory control circuit can include multiple delay elements. A structure as discussed above can provide the multiple delay elements nearly as space efficiently as corresponding I-RC-I delay elements that are not PVT compensated. In such an example, each delay element can include the interface circuit and a second control transistor of the charge-current coupling circuit 120. However, all the interface circuits 113 can share a single instance of the first compensation circuit 106, the optional second compensation circuit 107 and the first control transistor and the matching transistor 122 of the charge-current coupling circuit 120. In certain examples, PVT variation of a delay interval can be reduced significantly. For example, uncompensated I-RC-I structures have shown to have ±35% interval variation across PVT including supply voltage variation of 1.1V-1.4V. When used with a regulated supply, for example at 1.2V, variation can still be ±30% across PVT. Using the compensation circuits described above, delay interval variation can be reduced to ±9.6% across PVT including supply voltage variation of 1.1V-1.4V, and ±3.6% across PVT using a regulated supply voltage.

In certain examples, one or more RC-based delay elements 100 can be integrated on a single integrated circuit such that PVT variations of like components are nearly identical and the compensation, for example, of the trip voltage is very effective. In such examples, adding the first and second compensation circuits 106, 107 can be very efficient as such circuits can make use of spare transistors typically available in such circuits. In addition, in certain examples, the capacitor 102 can be formed from a transistor.

Figure 2:
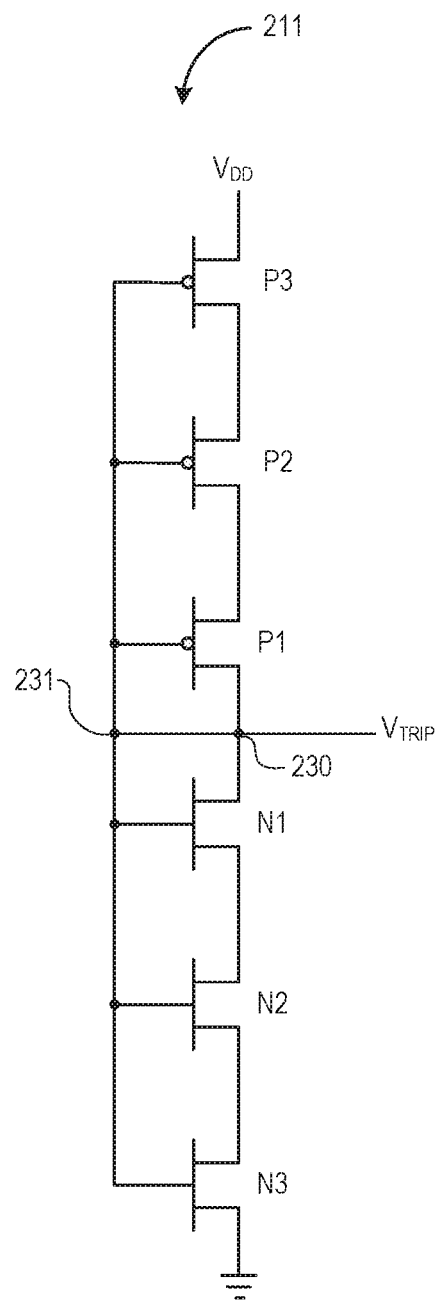
FIG. 2 illustrates generally an alternative arrangement of transistors to provide the trip voltage (VTRIP) according to an example of the present subject matter.

FIG. 2 illustrates generally an alternative arrangement of transistors to provide the trip voltage ($V_{TRIP}$) according to an example of the present subject matter. In such an arrangement, a trip voltage ($V_{TRIP}$) can be provided with a circuit that consumes very little current. In the illustrated example, three n-channel transistors (N1, N2, N3) are coupled in series with each other and ground. Three p-channel transistors (P1, P2, P3) are coupled in series with each other and a supply voltage ($V_{DD}$). The series connected transistors ((N1, N2, N3), (P1, P2, P3)) are then coupled in series with each other at an output node 230. The control nodes of each of the transistors (N1, N2, N3, P1, P2, P3) are couple together at an input node 231. The input node 231 is coupled directly with the output node 230. Such an arrangement can allow for constant tracking of the inverter trip ($V_{TRIP}$) or threshold voltage without consuming much current.

Figure 3:
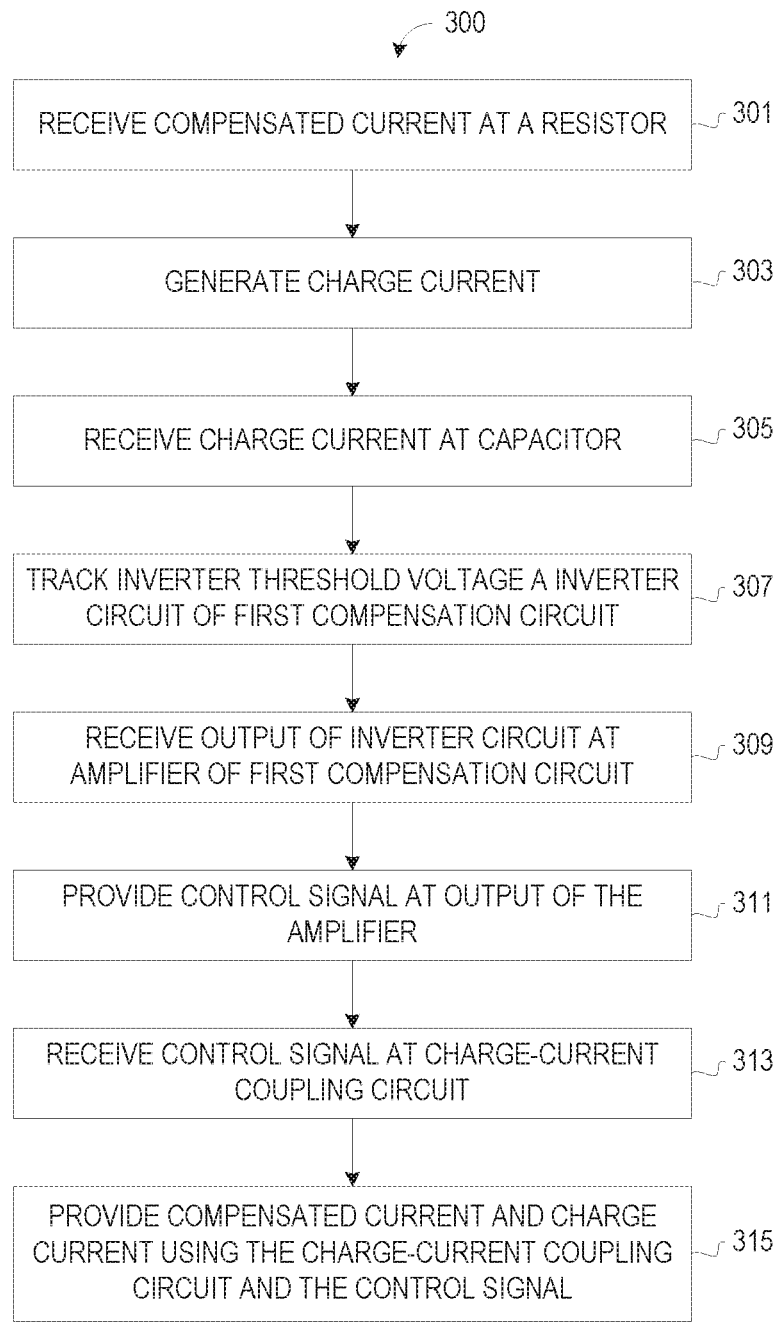
FIG. 3 illustrates generally a flowchart of a method 300 of operating a PVT-compensated integrated delay circuit according to various examples of the present subject matter.

FIG. 3 illustrates generally a flowchart of a method 300 of operating a PVT-compensated integrated circuit delay according to various examples of the present subject matter. At 301, a resistor of a RC-based delay circuit can pass a compensation current. In certain examples, the compensation current can be modified by one or more compensation circuits to alleviate variance of the delay interval of delay circuit. A first compensation circuit can be designed to eliminate or reduce delay interval variation the can result from PVT variations in the threshold voltage of output inverters of the delay circuit. A second compensation circuit can be designed to eliminate or reduce delay interval variation the can result from temperature variations associated the resistance, capacitance or the resistance and capacitance of the RC-based delay circuit. At 303, a charge current can be generated, and at 305 can be received at the capacitor or capacitance of the delay circuit. In certain examples, the charge current is representative of the compensated current provided to the resistor or resistance of the delay circuit.

At 307, an inverter or inverter-type circuit of a first compensation circuit can be arranged to track inverter threshold voltage or trigger voltage or trip voltage. In certain examples, the inverter or inverter-type circuit is fabricated with or is part of the same integrated circuit of the output inverters of the delay circuit. As such, PVT variations of the inverter or inverter-type circuit will reflect or track the variations of the output inverters including the PVT variations of the output inverter trip voltages.

At 309, the output of the inverter or inverter-type circuit can be received at an amplifier of the first tracking and, at 311, the amplifier can provide a control signal including at least a portion of which is representative of the output signal of the inverter or inverter-type circuit. At 13, the control signal can be received at the control nodes of current control transistors of charge-current coupling circuit, and, at 315, the current control transistors can provide the compensation current for the resistor and the charge current for the capacitor of the delay circuit.

In certain examples, a second compensation circuit modulate current actually received by the resistor and thus the current that resistor actually appears to resist. In doing so, the second compensation circuit ameliorates temperature variations of the resistance of the delay circuit. In some examples, the second compensation circuit can be sized and scaled to also ameliorate temperature variations of the capacitance of the delay circuit.

Additional Notes

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.)

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A delay circuit configured to receive an input signal and to provide a delayed representation of the input signal at an output, the delay circuit comprising:
    an input inverter having an input configured to directly receive the input signal of the delay circuit;
    a resistor configured to pass a compensation current;
    a capacitor configured to receive a charge current based on the compensation current;
    a first compensation circuit configured to provide a control signal, the first compensation circuit comprising:
    an inverter circuit configured to track an inverter threshold voltage across process, voltage and temperature variations, wherein an output of the inverter circuit is directly coupled to an input of the inverter circuit;
    an amplifier configured to receive the output of the inverter circuit an provide the control signal at an amplifier output;
    a charge-current coupling circuit configured to receive the control signal and to provide the compensation current and the charge current; and
    a second compensation circuit configured to modulate a portion of the compensation current to alleviate temperature variation effects cause by the resistor, the second compensation circuit having a first node of a mirror transistor of a current mirror coupled to a first node of the resistor and a second node of the mirror transistor coupled to a second node of the resistor, a sense transistor of the current mirror configured to receive a sense current that is proportional to absolute temperature and to modulate a portion of the compensation current using the mirror transistor of the current mirror.

2. The delay circuit of claim 1, wherein the charge-current coupling circuit includes a first control transistor, having a control node coupled directly to the amplifier output, configured to provide the compensation current.

3. The delay circuit of claim 2, wherein the charge-current coupling circuit includes a second control transistor, having a control node coupled directly to the amplifier output, configured to provide the charge current.

4. The delay circuit of claim 3, including an interface circuit configured to receive the input signal and to provide the delayed representation of the input signal, the interface circuit including the input inverter and a delay enable transistor coupled in series with the second control transistor of the charge-current coupling circuit; and
    wherein an output of the input inverter is coupled to a control node of the delay enable transistor.

5. The delay circuit of claim 3, wherein the charge-current coupling circuit includes a matching transistor coupled in series with the first control transistor.

6. The delay circuit of claim 4, wherein the interface circuit includes an output circuit configured to receive a charge voltage of the capacitor and to provide the delayed representation of the input signal, wherein the delayed representation of the input signal includes a delayed representation of a transition of the input signal, and wherein the charge current is indicative, in part, of the process, voltage and temperature variation of a trip voltage of the output circuit.

7. The delay circuit of claim 6, wherein the output circuit includes one or more output inverters and wherein the charge current is indicative, in part, of the process, voltage and temperature variation of a trip voltage of the one or more output inverters.

8. The delay circuit of claim 6, including a second circuit configured to receive the control signal and to provide a second delayed representation of the input signal at a second output, the second circuit comprising:
    a second capacitor configured to receive a second charging current; and
    a second charge-current coupling circuit configured to receive the control signal and to provide the second charge current.

9. A method for providing a delayed representation of an input signal at an output of a delay circuit, the method comprising:
    receiving the input signal of the delay circuit directly at an input inverter;
    passing a compensation current at a resistor of the delay circuit;
    generating a charge current representative of the compensation current;
    receiving the charge current at a capacitor of the delay circuit;
    tracking an inverter threshold voltage of an inverter circuit of a first compensation circuit across process, voltage and temperature variations using an output of the inverter circuit, wherein the output of the inverter circuit is directly coupled to an input of the inverter circuit,
    receiving the output of the inverter circuit at an amplifier of the first compensation circuit;
    providing a control signal at an output of the amplifier;
    receiving the control signal at a charge-current coupling circuit;
    providing the compensation current and the charge current using the charge-current coupling circuit and the control signal;

modulating a portion of the compensation current to alleviate temperature variation effects of the resistor using a second compensation circuit, wherein the modulating includes receiving a sense current that is proportional to absolute temperature at a sense transistor of a current mirror of the second compensation circuit, and modulating the portion of the compensation current using a mirror transistor, of the current mirror, coupled across the resistor.

10. The method of claim 9, including:
receiving the control signal at a control node of a first control transistor of the charge-current coupling circuit; and
providing the compensation current using the first control transistor.

11. The method of claim 10, including:
receiving the control signal at a control node of a second control transistor of the charge-current coupling circuit; and
providing the charge current using the second control transistor.

12. The method of claim 11, including:
receiving the input signal at an interface circuit of the delay circuit, the interface circuit including the input inverter;
providing the delayed representation of the input signal at an output of the interface circuit,
controlling the charge current to the capacitor using a delay enable transistor of the interface circuit, the delay enable transistor coupled in series with the second control transistor of the charge-current coupling circuit.

13. The method of claim 12, including maintaining a matching transistor in a low impedance state, the matching transistor coupled in series with the first control transistor.

14. The method of claim 13, including:
providing a charge control signal in a delay enable state to the delay enable transistor when the input signal is in a first state, the delay enable state configured to enable the delay enable transistor to couple the charge current with the capacitor.

15. The method of claim 13, includes:
receiving a charge voltage of the capacitor at an output circuit of the interface circuit;
providing the delayed representation of the input signal at an output of the output circuit,
wherein the delayed representation of the input signal includes a delayed representation of a transition of the input signal, and
wherein the charge current is indicative, in part, of the process, voltage and temperature variation of a trip voltage of the output circuit.

16. The method of claim 15, wherein the output circuit includes one or more output inverters; and
wherein the charge current is indicative, in part, of the process, voltage and temperature variation of a trip voltage of the one or more output inverters.

* * * * *